United States Patent
Ahn et al.

(10) Patent No.: US 6,690,093 B2
(45) Date of Patent: Feb. 10, 2004

(54) METAL CONTACT STRUCTURE IN SEMICONDUCTOR DEVICE AND METHOD FOR FORMING THE SAME

(75) Inventors: Tae-hyuk Ahn, Yongin (KR); Myeong-cheol Kim, Suwon (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 40 days.

(21) Appl. No.: 09/878,944

(22) Filed: Jun. 13, 2001

(65) Prior Publication Data

US 2002/0074665 A1 Jun. 20, 2002

(30) Foreign Application Priority Data

Dec. 14, 2000 (KR) .......................... 2000-76496

(51) Int. Cl.$^7$ .................................. H01L 23/48
(52) U.S. Cl. ................. 257/774; 257/773; 257/767; 257/768; 257/770; 257/751; 257/752; 438/702; 438/703
(58) Field of Search ................ 257/773, 774, 257/767, 768, 770, 750, 751, 752, 769; 438/696, 702, 703, 713, 714; 437/195, 200, 247

(56) References Cited

U.S. PATENT DOCUMENTS

| | | | | |
|---|---|---|---|---|
| 5,534,463 A | * | 7/1996 | Lee et al. ................ | 437/195 |
| 5,589,713 A | * | 12/1996 | Lee et al. ................ | 257/773 |
| 5,939,746 A | * | 8/1999 | Koyama et al. ............ | 257/306 |
| 6,037,261 A | * | 3/2000 | Jost et al. ................ | 438/696 |
| 6,153,527 A | * | 11/2000 | Jost et al. ................ | 438/696 |
| 6,184,081 B1 | * | 2/2001 | Jeng et al. ................ | 438/253 |
| 6,228,757 B1 | * | 5/2001 | Sengupta et al. ........... | 438/622 |
| 6,251,725 B1 | * | 6/2001 | Chiou et al. ............... | 438/253 |
| 6,294,425 B1 | * | 9/2001 | Hideki ....................... | 438/253 |
| 6,348,709 B1 | * | 2/2002 | Graetinger et al. ......... | 257/311 |
| 6,380,084 B1 | * | 4/2002 | Lim et al. .................. | 438/687 |
| 6,388,282 B1 | * | 5/2002 | Hieda ........................ | 257/300 |

* cited by examiner

*Primary Examiner*—Nathan J. Flynn
*Assistant Examiner*—Fazli Erdem
(74) *Attorney, Agent, or Firm*—Lee & Sterba, P.C.

(57) ABSTRACT

A metal contact structure of a semiconductor device and a method for forming the same, wherein an upper conductive layer is formed by etching a metal layer, which fills a contact hole and is formed on the entire surface of an interlayer dielectric film and etching is stopped when barrier metal layers under the metal layer is exposed. Then, after forming spacers on the sidewalls of an upper conductive layer, the barrier metal layers (a barrier layer and an ohmic layer) are removed using the spacers as etching masks. Therefore, it is possible to prevent problems due to etch mask misalignment, such as 1) an etching gas of the metal layer permeating through the ohmic layer and 2) defects such as contact resistance changes that occur when spacers cover a contact hole even though the upper conductive layer does not completely cover that contact hole.

12 Claims, 2 Drawing Sheets

METAL CONTACT STRUCTURE IN SEMICONDUCTOR DEVICE AND METHOD FOR FORMING THE SAME

BACKGROUND OF THE INVENTION

1. Field of the Invention

The present invention relates to a semiconductor device. More particularly, the present invention relates to a metal contact structure in a semiconductor device and a method for forming the same.

2. Description of the Related Art

A conventional semiconductor device is formed by stacking a predetermined number of conductive layers and an interlayer dielectric film on a semiconductor substrate. The conductive layers include wiring which is typically constructed using polycrystalline silicon doped with impurities. Alternatively, metals such as W, Al, Cu, or metal silicide, which have excellent conductive characteristics, can be used as the wiring material. In general, a metal wiring structure includes wiring longitudinally extended in a horizontal direction parallel to the surface of a substrate and two or more contact structures for connecting regions of a substrate, such as termination points, or for connecting vertically arranged conductive layers together in a vertical direction. The contact structure consists of an upper conductive layer (upper wiring) and a lower conductive layer (lower wiring), between which is interposed an interlayer dielectric film. Included in this contact structure is a hole having a conductive plug, which extends from the upper to the lower conductive layers. This conductive plug can be deposited into the previously etched hole during the deposition of the upper wiring. When the contact plug is formed using a metal material, it is referred to as a "metal contact plug."

As the integration density of a semiconductor device increases, the width of a conductive layer (the wiring) is reduced accordingly, and the precision and uniformity of the line width must be more rigidly controlled in the formation of the metal contact structure.

FIG. 1 illustrates a sectional end view of a metal contact structure of a conventional dynamic random access memory (DRAM). A metal conductor 28 is formed of W as the upper conductive layer, and is connected to a drain region 12 on a substrate 10 through a conductive pad 18 of a lower conductive layer 20. Although conductor 28 may be directly connected to the drain region 12 without pad 18 for lower density structures, this becomes impractical for higher integration densities. As the distance between a pair of gate electrodes 14 becomes smaller, the use of a pad 18, which is formed by a self alignment method using sidewall spacers 16 of the gate electrodes 14 is widely used.

In the contact structure, conductor 28 fills a contact hole 22' and is in contact with the pad 18. Barrier metal 24 and 26 are thinly formed on the bottom and sidewalls of the contact hole 22' between the conductor 28 and the pad 18. The barrier metal layers 24 and 26 may be referred to as an ohmic layer 24 and a barrier layer 26.

A method for forming a metal contact structure is as follows. After forming the pad 18 and an interlayer dielectric film 22, which covers the pad 18, a contact hole 22', which exposes some of the pad 18, is formed by etching the interlayer dielectric film 22. The ohmic layer 24 formed of Ti and the barrier layer 26 formed of TiN are formed over the entire surface of the interlayer dielectric film 22 including contact hole 22'. A W layer is formed over the entire surface of barrier layer 26, and the conductor 28 is completed by patterning the form of conductor 28 and etching to remove all non-patterned regions of the W layer, the ohmic layer 24, and the barrier layer 26, excluding the region under conductor 28.

As the integration density increases, the width of the conductor 28, that is, the W layer left after performing etching, is reduced. Furthermore, as shown in FIG. 1, the conductor 28 may not completely cover the contact hole 22' thereby exposing some of the sidewalls of the contact hole 22'. When conductor 28 does not completely cover contact hole 22', etching gas mainly formed of $SF_6$ that is used during the etching of conductor 28 reacts with the Ti of ohmic layer 24, at the bottom of contact hole 22'. Accordingly, a TiFx portion 24', which is an insulating material, is formed, thereby increasing contact resistance.

Additional disadvantages of using conventional fabrication techniques in higher density integration applications include misalignment of etching masks and increased interelectrode capacitances that occur as conductor separation distances are reduced.

SUMMARY OF THE INVENTION

It is a feature of an embodiment of the present invention to provide a metal contact structure of a semiconductor device, which protects contact holes from incomplete coverage by overlaying conductive layers, including a preferred method for construction thereof.

It is another feature of an embodiment of the present invention to provide a method for forming a metal contact structure of a semiconductor device that has the above structure.

Accordingly, a metal contact structure of a semiconductor device includes a lower conductive layer, an interlayer dielectric film, which is formed on the lower conductive layer and in which a contact hole exposing some of the lower conductive layer is formed, a metal upper conductive layer connected to the lower conductive layer through the contact hole, insulating layer spacers on the sidewalls of the upper conductive layer, and barrier metal layers interposed between the upper conductive layer and the lower conductive layer. The barrier metal layers, aligned with the first spacers, are formed on the bottom and the sidewalls of the contact hole under the upper conductive layer and on the surface of the interlayer dielectric film under the first spacers, and extend beyond the width of the upper conductive layer.

In another embodiment of the present invention, an upper conductive layer formed of a metal is formed by etching a metal layer, which is formed on the entire surface of an interlayer dielectric film and fills a contact hole, and etching is stopped when a barrier layer under the metal layers is exposed. Preferably, the barrier layer is a barrier metal layer. After forming spacers on the sidewalls of the upper conductive layer, the barrier metal layers are removed by using the spacers as etching masks. More specifically, the contact hole that exposes some of a lower conductive layer is formed by forming the lower conductive layer and the interlayer dielectric film that covers the lower conductive layer and etching the interlayer dielectric film. The barrier metal layers are formed on the entire surface of the interlayer dielectric film including the contact hole. The metal layer is formed on the entire surface of the barrier metal layers. The upper conductive layer is formed by etching the metal layer to have a predetermined pattern until the barrier metal layers are exposed. The spacers formed of an insulating material are formed on the sidewall of the upper conductive layer. The barrier metal layers are etched until the interlayer dielectric film is exposed using the spacers as the etching masks and thus, are removed.

These and other features of the present invention will be readily apparent to those of ordinary skill in the art upon review of the detailed description that follows.

BRIEF DESCRIPTION OF THE DRAWINGS

The above features and advantages of the present invention will become more apparent by describing in detail a preferred embodiment thereof with reference to the attached drawings in which.

DETAILED DESCRIPTION OF THE PREFERRED EMBODIMENTS

Figure 1:
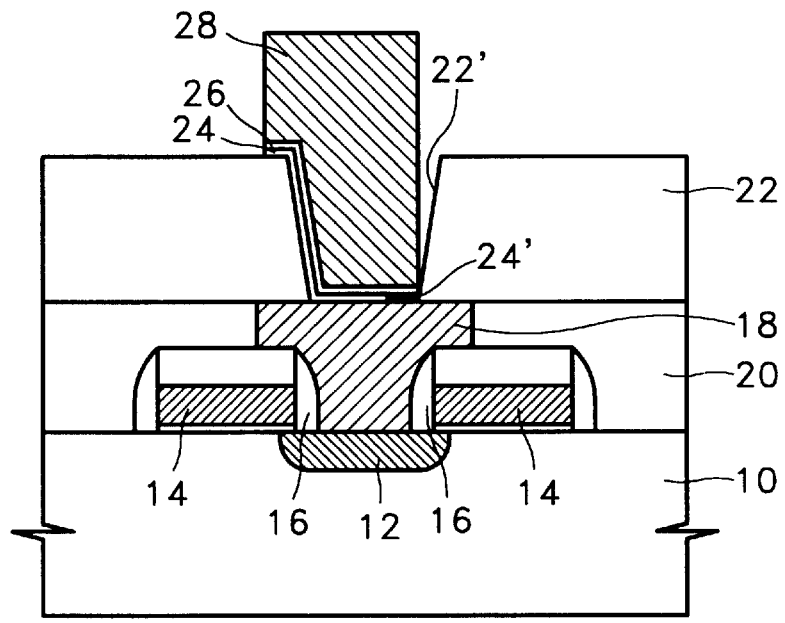
FIG. 1 illustrates a sectional end view showing a conventional metal contact structure according to the prior art.

Korean Patent Application No. 00-76496, filed Dec. 14, 2000, and entitled: "Metal Contact Structure in Semiconductor Device and Method for Forming Same," is incorporated by reference herein in its entirety.

The present invention now will be described more fully with reference to the accompanying drawings, in which preferred embodiments of the invention are shown. In the drawings, the thickness of layers and regions are exaggerated for clarity. Also, like reference numerals in different drawings represent like elements. It will further be understood that when a layer is referred to as being "on" another layer or substrate, it can be directly on the other layer or substrate, or intervening layers may also be present.

Figure 2:
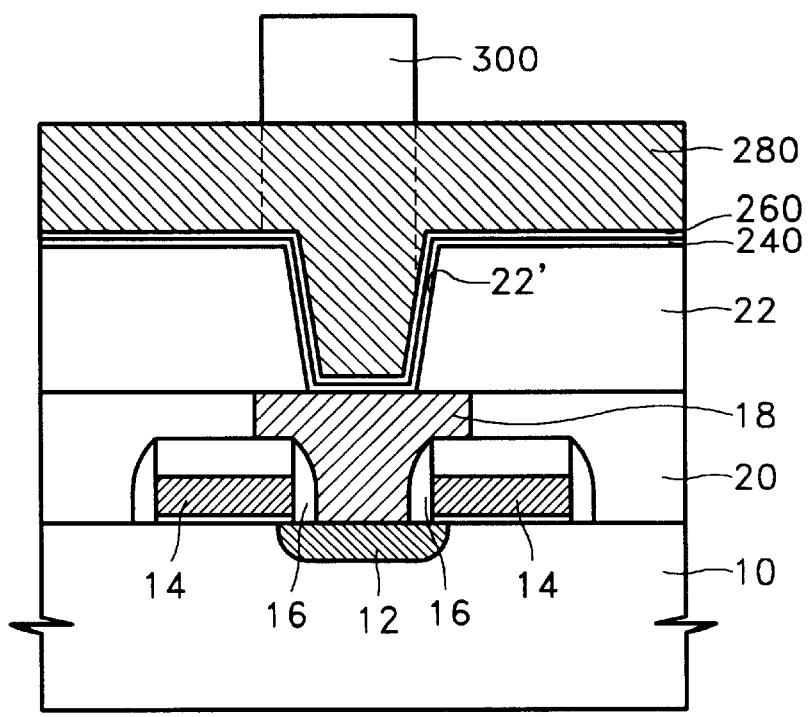
FIGS. 2 through 4 illustrate sectional views showing processes of forming a metal contact structure according to the method of the present invention and the metal contact structure formed as a result.
Figure 3:
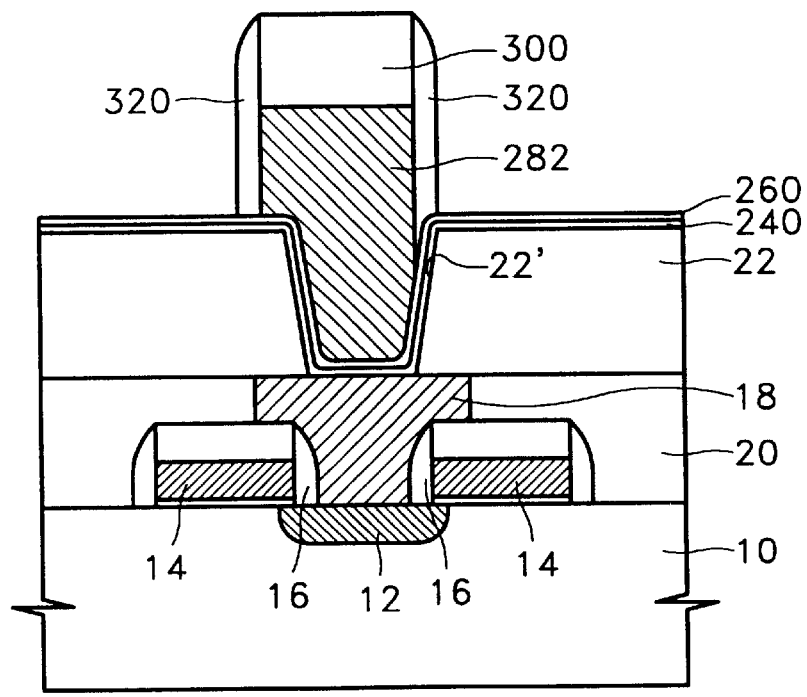
Figure 4:
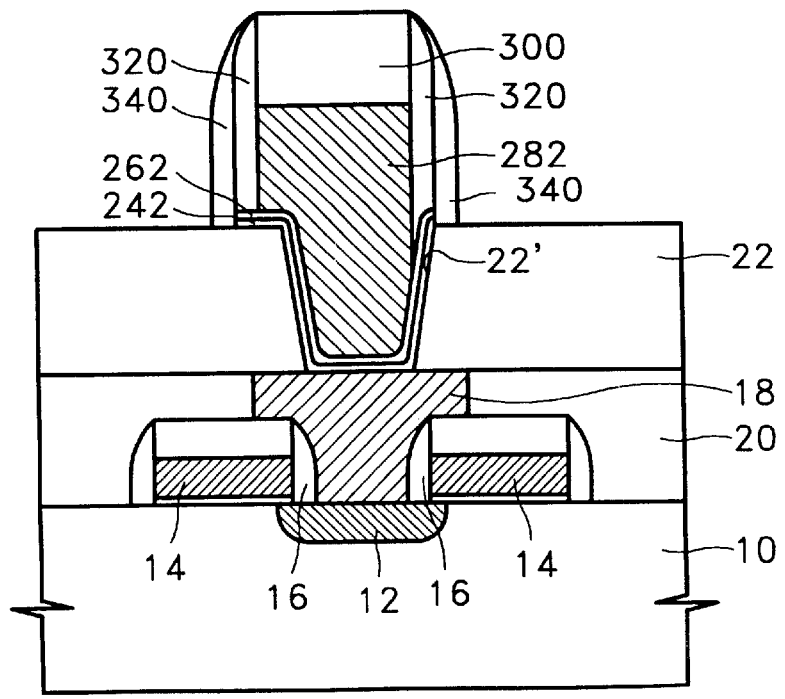

FIGS. 2 through 4 illustrate sectional views showing exemplary processes of forming a metal contact structure according to the method of the present invention and showing a resultant metal contact structure thus formed. An upper conductive layer becomes a conductor 282 of FIG. 3 and a lower conductive layer becomes a pad 18. Preferably, the conductor 282 is a bit line and pad 18 is a bit line pad. Since processes from the beginning to the completion of the formation of a contact hole 22' are the same as those of the above-mentioned conventional method, the description thereof will be omitted.

Referring to FIG. 2, after forming the contact hole 22' on an interlayer dielectric film 22, the barrier metal layers 240 and 260 are formed on the entire surface of the interlayer dielectric film 22 including the contact hole 22'. The barrier metal layers 240 and 260 may be formed by stacking, for example, an ohmic layer 240 formed of Ti and a barrier layer 260 formed of TiN. The ohmic layer 240 may be formed of other metals, such as Ta, which have an excellent resistance characteristic and an excellent adhesive property to the upper and lower conductive layers. The barrier layer 260 may be formed of other metal nitride films, such as a TaN film, which have an excellent characteristic of preventing diffusion of a material that forms the upper and lower conductive layers. The barrier metal layer 260 may be formed by stacking at least three layers formed of at least two materials. The ohmic layer 240 and the barrier layer 260 may be formed by a physical vapor deposition method, such as sputtering or a chemical vapor deposition method, which is widely known.

A metal layer 280, which will become conductor 282 of FIG. 3, is formed on the entire surface of the barrier layer 260. Exemplary metals used for layer 280 can be one or more compounds from the group consisting of W, metal silicide such as W silicide, Al, and Cu. The metal layer 280 may be formed by the widely known physical vapor deposition method or chemical vapor deposition method.

An etching mask 300 is formed on the metal layer 280 in order to form conductor 282 of FIG. 3. Etching mask 300 is preferably formed of an insulating material, such as a silicon nitride film. This allows etching mask 300 to operate as a capping film when a lower electrode contact hole of a capacitor (not shown) is formed after forming conductor 282 as in FIG. 3 when a capacitor over bit line (COB) structure is etched by a self-alignment method. Since capping film is not necessary when the self-alignment etching method is not used, etching mask 300 may be formed using a photoresist.

The dotted line of FIG. 2 illustrates the form of conductor 282 of FIG. 3 when etching mask 300 on metal layer 280 is misaligned and contact hole 22' is not completely covered, thus exposing some of the sidewalls of the contact hole 22'.

In FIG. 3, an exemplary W layer 282 is etched by plasma etching, wherein a gas including fluorine, such as $SF_6$ or $NF_3$ may be used as the etching gas. $N_2$ may be added to protect the sidewalls of the etched W layer. Since plasma activation is weak in $SF_6$ or $NF_3$ gas, $Cl_2$ can be added in order to compensate for the weak plasma activation.

The etching of the W layer must be stopped at the barrier layer 260 formed of TiN. When the etching of the W layer is not stopped at the barrier layer 260 and proceeds to the ohmic layer 240, the above mentioned shortcomings result. Namely, the etching gas including fluorine permeates the ohmic layer 240 formed of Ti, thus generating an insulating material TiFx, and contact resistance is increased. In order to stop etching at the barrier layer 260, transformer coupled plasma (TCP) equipment or decoupled plasma source (DPS) equipment, which can perform high density plasma etching, is preferably used and a bias power source applied to the substrate 10 is preferably less than 100 W.

After forming an insulating layer, such as a silicon nitride film, on the entire surface of layer 260, first insulating layer spacers 320 (first spacers) are formed on the sidewalls of the etching mask 300 and conductor 282 by anisotropically etching the insulating layer. At this time, as mentioned above, if photoresist is used as the etching mask 300 instead of the insulating layer, the photoresist is removed after etching the W layer 280. Hence, the first spacers 320 are formed. In this case, the first spacers are formed only on the side walls of conductor 282. Since the first spacers 320 are formed on the sidewalls of conductor 282, the sidewalls of the exposed contact hole 22' are covered.

The barrier metal layers 240 and 260, that is, the barrier layer 260 formed of the exemplary TiN film and the ohmic layer 240 formed of exemplary Ti, are etched using the first insulating layer spacers 320 as the etching masks. Accordingly, the interlayer dielectric film 22 is etched. The barrier layer 260 and the ohmic layer 240 are etched and removed to prevent another conductor (not shown) adjacent to conductor 282 from causing a short circuit. When the barrier layer 260 and the ohmic layer 240 are formed of the TiN film and the Ti film, respectively, the barrier layer 260 and the ohmic layer 240 may be plasma etched using $Cl_2$. $N_2$ or HBr gas may be added to the $Cl_2$ gas. Also, slight isotropic etching is preferably performed so that the barrier metal layers 242 and 262 are created and aligned with the insulating layer spacers 320 and correctly etched, namely, that the barrier metal layers 242 and 262 are not etched on a tilt so as to not leave a tail. As a result, the barrier metal layers 242 and 262 are preferably high density plasma etched using the TCP equipment or the DPS equipment like in the etching of the W layer and using the above mentioned etching gas. The bias power source applied to the substrate 10 is preferably less than 200 W.

Referring to FIG. 4, second insulating layer spacers 340 (second spacers) are formed on the sidewalls of the first spacers 320 by forming the insulating layer such as the silicon nitride film on the entire surface of the assembly including the exposed interlayer dielectric film 22 and anisotropically etching the insulating layer. Then, the second spacers 340 are in contact with the sidewalls of the first spacers 320 and the exposed side surfaces of the barrier metal layers 242 and 262. The bottoms of the second spacers 340 are in contact with the interlayer dielectric film 22. The second spacers 340 operate as capping spacers together with the capping film used as the etching mask 300 when a capacitor lower electrode contact hole (not shown) is formed in the interlayer dielectric film. Second spacers 340 operate similarly when a contact hole that exposes an active region (not shown) of the substrate 10 is formed in the interlayer dielectric film 22 by the self alignment method and between conductors in a subsequent process.

In a case where the second spacers 340 do not exist, and when the interlayer dielectric film 22 between conductors 282 is etched by the self alignment method, the barrier metal layers 262 and 242 formed under the first spacer 320 are exposed. Accordingly, a conductive material that is formed between adjacent conductors causes a short circuit between barrier metal layers 262 and 242. As a result, when the contact hole formed between adjacent conductors is formed by the self alignment method, the second spacers 340 are necessary. As mentioned above, when it is not necessary to etch the contact hole 22' by the self alignment method after forming adjacent conductors, the second spacers 340 are not necessary.

As a result, as shown in FIG. 4, the metal contact structure according to a preferred embodiment of the present invention comprises a structure in which the barrier metal layers 262 and 242 are aligned with the first spacers 320, and thus extend beyond the width of conductors 282 and below the first spacers 320.

Although the present invention was described in detail with reference to a conductor 282, the present invention is not restricted to such a metal contact structure. For example, in a preferred embodiment, conductor 282 may be fabricated as common upper wiring instead of metal conductors, and also fabricated as a simple contact pad (for example, 18 of FIG. 4) instead of wiring.

Furthermore, although the metal contact structure of a preferred embodiment does not have an additional contact plug, the present invention can be applied to a metal contact structure having such a contact plug. Namely, conductor 282 of FIG. 4 becomes the contact plug and includes wiring in the form of a line, which is in contact with an upper portion of the contact plug. In such a case, capping film 300 or the second spacer 340 is not necessary. Also, the contact plugs, that is, conductor 282 and the first spacer 320 of FIG. 4 are preferably lower in height than conductor 282 and the first spacer 320 shown in FIG. 4.

As mentioned above, according to an embodiment of the present invention, when the upper conductive layer is formed by depositing the metal layer and the barrier metal layer over the entire surface of the interlayer dielectric film, the metal layer is etched in the pattern where the barrier metal layer is to remain. Then, the insulating layer spacers are formed on the sidewalls of the upper conductive layer, and the barrier metal layer is etched using the insulating layer spacers as the etching masks. Thus, it is evident from the foregoing that by using the structure and method of the present invention, diffusive permeations, contact resistance defects, and short circuits that result from over-etching that can be caused by misalignment of masks can be prevented in high density integrated circuits.

While the present invention has been particularly described with reference to preferred embodiments thereof, it will be understood by those of ordinary skill in the art that various changes in form and details may be made therein without departing from the spirit and scope of the invention as defined by the appended claims.

What is claimed is:

1. A metal contact structure of a semiconductor device, comprising:

a lower conductive layer;

an interlayer dielectric film, which is formed on the lower conductive layer and in which is formed a contact hole having a bottom and a top and sidewalls and which exposes a portion of the lower conductive layer;

at least one barrier metal layer formed on the bottom and the sidewalls of the contact hole, and extending beyond the width of the contact hole at the top of the contact hole;

an upper conductive layer formed of a metal on the interlayer dielectric film and connected to the lower conductive layer through the contact hole;

first spacers formed of an insulating material on the sidewalls of the upper conductive layer protruding above the interlayer dielectric film;

second spacers formed of an insulating material on the sidewalls of the first spacers and exposed side surfaces of the barrier metal layers and whose bottoms are in contact with the interlayer dielectric film;

wherein the at least one barrier metal layer that extends beyond the width of the contact hole at the top of the contact hole is aligned with the first spacers, and thus extends beyond a width of the upper conductive layer and below the first spacers.

2. The metal contact structure of claim 1, further comprising a capping film formed on the metal layer of an insulating material.

3. The metal contact structure of claim 1, wherein the upper conductive layer is formed of W, W-silicide, Al, or Cu.

4. The metal contact structure of claim 1, wherein the barrier metal layers are formed by stacking an ohmic layer of Ti or Ta and a barrier layer of TiN or TaN.

5. The metal contact structure of claim 1, wherein the upper conductive layer is extended in a horizontal direction and forms a conductor.

6. The metal contact structure of claim 5, wherein the conductor is a bit line.

7. A method for forming a metal contact structure of a semiconductor device comprising:

forming a lower conductive layer and an interlayer dielectric film covering the lower conductive layer;

forming a contact hole exposing a portion of the lower conductive layer by etching the interlayer dielectric film;

forming at least one barrier layer on the surface of the interlayer dielectric film and including the contact hole;

forming a metal layer on the surface of the at least one barrier layer;

forming an upper conductive layer protruding above the interlayer dielectric film by etching a selected portion of the metal layer until the at least one barrier layer is exposed;

forming first spacers of an insulating material on the sidewalls of the upper conductive layer;

etching the at least one barrier layer until the interlayer dielectric film is exposed using the first spacers as etching masks, so that the at least one barrier metal layer extends beyond a width of the upper conductive layer and remains below the first spacers; and forming second spacers of an insulating material on the sidewalls of the first spacers and the exposed side surfaces of the barrier layers.

8. The method of claim 7, further comprising forming a capping film formed of an insulating material on the metal layer to have the shape of the upper conductive layer before forming the upper conductive layer, wherein the metal layer is etched using the capping film as the etching mask in the step of forming the upper conductive layer, and wherein the first spacers are formed on the sidewalls of the capping film in the step of forming the first spacers.

9. The method of claim 7, wherein the metal layer is formed of W, W-silicide, Al, or Cu.

10. The method of claim 7, wherein the barrier layers are barrier metal layers.

11. The method of claim 10, wherein the barrier metal layers are formed by stacking an ohmic layer of Ti or Ta and a barrier layer of TiN or TaN.

12. The method of claim 7, wherein the upper conductive layer is formed of a bit line extended in a horizontal direction.

* * * * *